(12) United States Patent
Hung (10) Patent No.: US 11,037,796 B2
(45) Date of Patent: Jun. 15, 2021

(54) MANUFACTURING METHOD OF SEMICONDUCTOR DEVICE STRUCTURE

(71) Applicant: UNITED MICROELECTRONICS CORP., Hsinchu (TW)

(72) Inventor: Ching-Wen Hung, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 35 days.

(21) Appl. No.: 16/692,435

(22) Filed: Nov. 22, 2019

(65) Prior Publication Data

US 2020/0098584 A1 Mar. 26, 2020

Related U.S. Application Data

(62) Division of application No. 15/698,765, filed on Sep. 8, 2017, now Pat. No. 10,529,580.

(30) Foreign Application Priority Data

Aug. 3, 2017 (CN) .......................... 201710654840.3

(51) Int. Cl.
*H01L 21/3105* (2006.01)
*H01L 23/522* (2006.01)
(Continued)

(52) U.S. Cl.
CPC .............. *H01L 21/31053* (2013.01); *H01L 21/823475* (2013.01); *H01L 23/522* (2013.01);
(Continued)

(58) Field of Classification Search
CPC ........... H01L 28/20–26; H01L 23/5228; H01L 27/0629; H01L 27/0635
See application file for complete search history.

(56) References Cited

U.S. PATENT DOCUMENTS 6,172,389 B1 1/2001 Sakoh
8,154,104 B2 4/2012 Shin et al.
(Continued)

FOREIGN PATENT DOCUMENTS

CN 101373765 A 2/2009
CN 102623483 A 8/2012
TW 201626521 A 7/2016

OTHER PUBLICATIONS

Hsiao, et al, "High-Voltage Metal-Oxide-Semiconductor Transistor and Fabrication Method Thereof", U.S. Appl. No. 15/191,535, filed Jun. 24, 2016, Applicant: United Microelectronics Corp.
(Continued)

*Primary Examiner* — John A Bodnar
(74) *Attorney, Agent, or Firm* — WPAT, PC (57) ABSTRACT

A manufacturing method of a semiconductor device structure is provided. The semiconductor device structure includes a semiconductor substrate having an active component region and a non-active component region, a first dielectric layer, a second dielectric layer, high resistivity metal segments, dummy stacked structures and a metal connection structure. The high resistivity metal segments are formed in the second dielectric layer and located in the non-active component region. The dummy stacked structures are located in the non-active component region, and at least one dummy stacked structure penetrates through the first dielectric layer and the second dielectric layer and is located between two adjacent high resistivity metal segments. The metal connection structure is disposed on the second dielectric layer, and the high resistivity metal segments are electrically connected to one another through the metal connection structure.

10 Claims, 9 Drawing Sheets

(51) Int. Cl.
   *H01L 23/00*      (2006.01)
   *H01L 21/8234*    (2006.01)
   *H01L 27/088*     (2006.01)
   *H01L 27/06*      (2006.01)

(52) U.S. Cl.
   CPC ........ *H01L 23/5228* (2013.01); *H01L 23/564* (2013.01); *H01L 27/0629* (2013.01); *H01L 27/088* (2013.01)

(56) References Cited

U.S. PATENT DOCUMENTS

| | | |
|---|---|---|
| 9,401,358 B1 | 7/2016 | Hung et al. |
| 2005/0140012 A1 | 6/2005 | Jung |
| 2008/0122035 A1 | 5/2008 | Watanabe |
| 2010/0052075 A1 | 3/2010 | Yeh et al. |
| 2010/0090340 A1 | 4/2010 | Summerfelt et al. |
| 2017/0345884 A1 | 11/2017 | Choi et al. |

OTHER PUBLICATIONS

Office Action issued by China National Intellectual Property Administration dated Jun. 3, 2020.

MANUFACTURING METHOD OF SEMICONDUCTOR DEVICE STRUCTURE

This application is a divisional application of U.S. application Ser. No. 15/698,765, filed on Sep. 8, 2017, which claims the benefit of People's Republic of China application Serial No. 201710654840.3, filed Aug. 3, 2017, the subject matter of which is incorporated herein by reference.

BACKGROUND

Technical Field

The present disclosure relates in general to a manufacturing method of a semiconductor device structure, and more particularly to a manufacturing method of a semiconductor device structure including dummy stacked structures.

Description of the Related Art

In the process of forming semiconductor devices, chemical mechanical polishing (CMP) processes are usually required for removing undesired layers and/or for planarization. In order to prevent any undesired and/or unexpected influences that may be caused by the CMP processes on the semiconductor devices, researches and developments in manufacturing of such devices have been disclosed.

SUMMARY OF THE INVENTION

The present disclosure is directed to a manufacturing method of a semiconductor device structure. According to the embodiments of the present disclosure, with the design of disposing dummy stacked structures in the dielectric layer located in the non-active component region, the dishing extent which is caused by the influence of the chemical mechanical polishing (CMP) process performed on large areas of the surface of the dielectric layer can be reduced, such that the surface of the dielectric layer located in the non-active component region can remain planar despite the CMP process performed on large areas of the surface, and the situation where the materials of other films formed in subsequent processing steps remain on the dishing recessed surface can be further prevented.

According to an embodiment of the present disclosure, a semiconductor device structure is disclosed. The semiconductor device structure includes a semiconductor substrate, a first dielectric layer, a second dielectric layer, a plurality of high resistivity metal segments, a plurality of dummy stacked structures and a metal connection structure. The semiconductor substrate has an active component region and a non-active component region. The first dielectric layer is formed on the semiconductor substrate, and the second dielectric layer is formed on the first dielectric layer. The high resistivity metal segments are formed in the second dielectric layer and located in the non-active component region, and the high resistivity metal segments are separated from one another. The dummy stacked structures are formed on the semiconductor substrate and located in the non-active component region, and at least one dummy stacked structure of the plurality of the dummy stacked structures penetrates through the first dielectric layer and the second dielectric layer and is located between two adjacent high resistivity metal segments of the plurality of the high resistivity metal segments. The metal connection structure is disposed on the second dielectric layer, and the high resistivity metal segments are electrically connected to one another through the metal connection structure.

According to another embodiment of the present disclosure, a manufacturing method of a semiconductor device structure is disclosed. The manufacturing method of the semiconductor device structure includes the following steps: providing a semiconductor substrate having an active component region and a non-active component region; forming a first dielectric layer on the semiconductor substrate; forming a second dielectric layer on the first dielectric layer; forming a plurality of high resistivity metal segments in the second dielectric layer and located in the non-active component region, wherein the high resistivity metal segments are separated from one another; forming a plurality of dummy stacked structures on the semiconductor substrate and located in the non-active component region, wherein at least one dummy stacked structure of the plurality of the dummy stacked structures penetrates through the first dielectric layer and the second dielectric layer and is located between two adjacent high resistivity metal segments of the plurality of the high resistivity metal segments; and forming a metal connection structure on the second dielectric layer, wherein the plurality of the high resistivity metal segments are electrically connected to one another through the metal connection structure.

The disclosure will become apparent from the following detailed description of the preferred but non-limiting embodiments. The following description is made with reference to the accompanying drawings.

DETAILED DESCRIPTION OF THE INVENTION

According to the embodiments of the present disclosure, a semiconductor device structure and a manufacturing method thereof are provided. The embodiments are described in details with reference to the accompanying drawings. The procedures and details of the embodiments are for exemplification only, not for limiting the scope of protection of the disclosure. Moreover, the identical or similar elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

Figure 1:
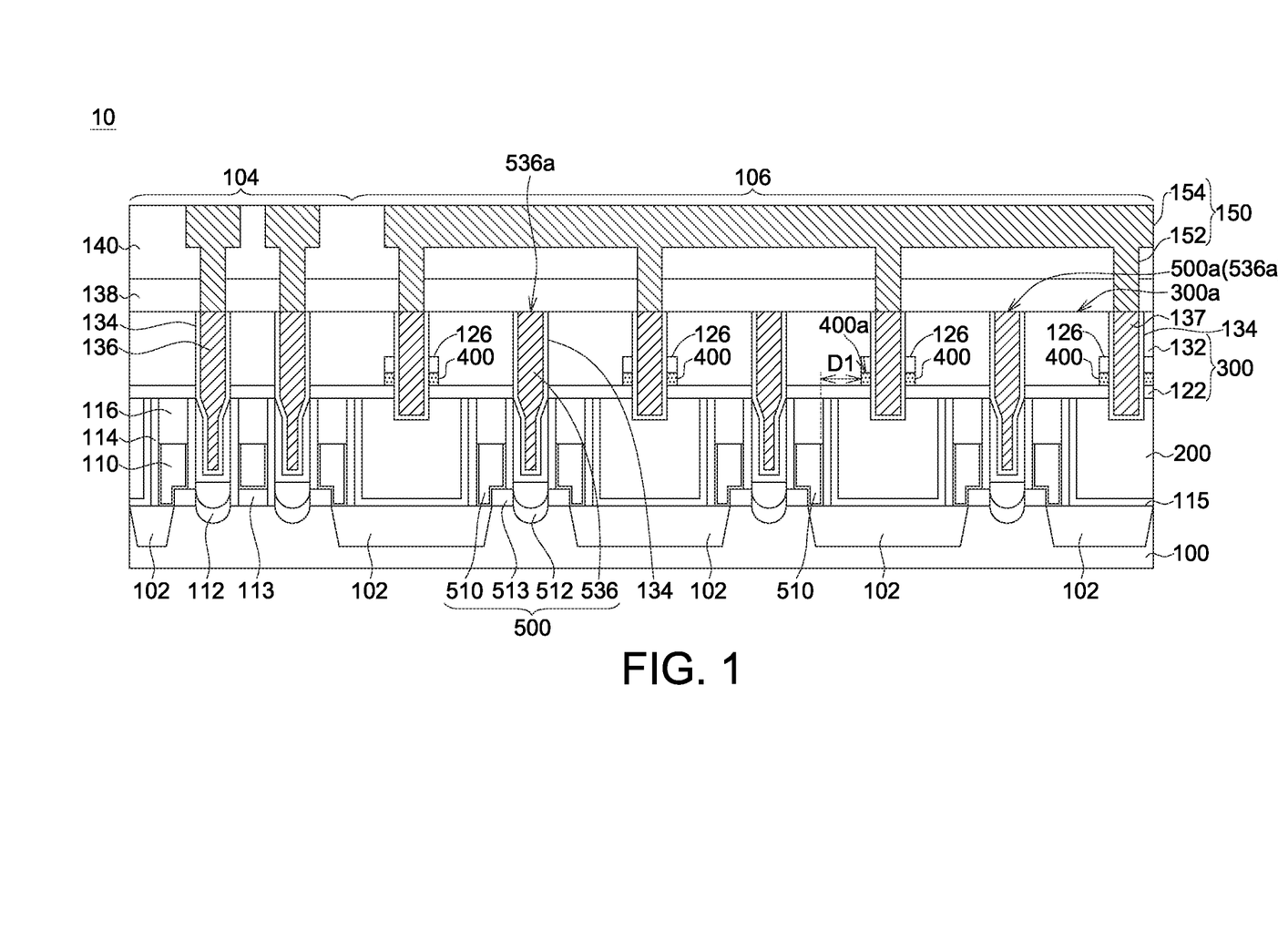
FIG. 1 shows a cross-sectional view of a semiconductor device structure according to an embodiment of the present disclosure.
Figure 2A:
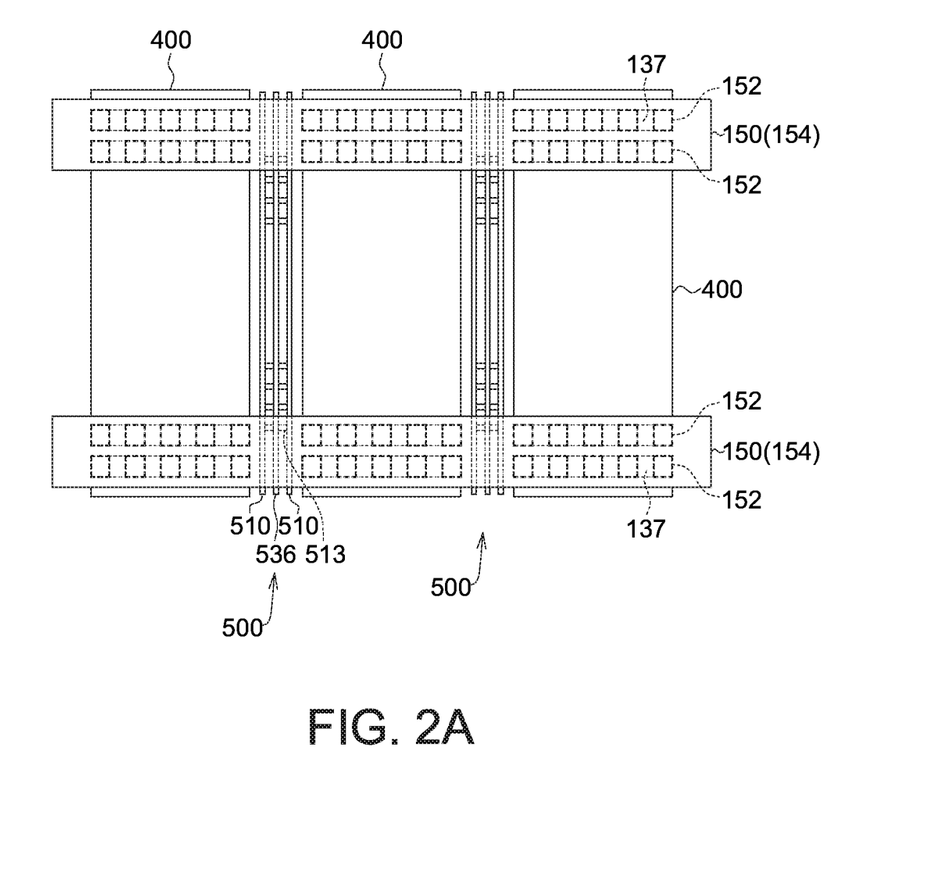
FIG. 2A shows a top view of a non-active component region of a semiconductor device structure according to another embodiment of the present disclosure.
Figure 2B:
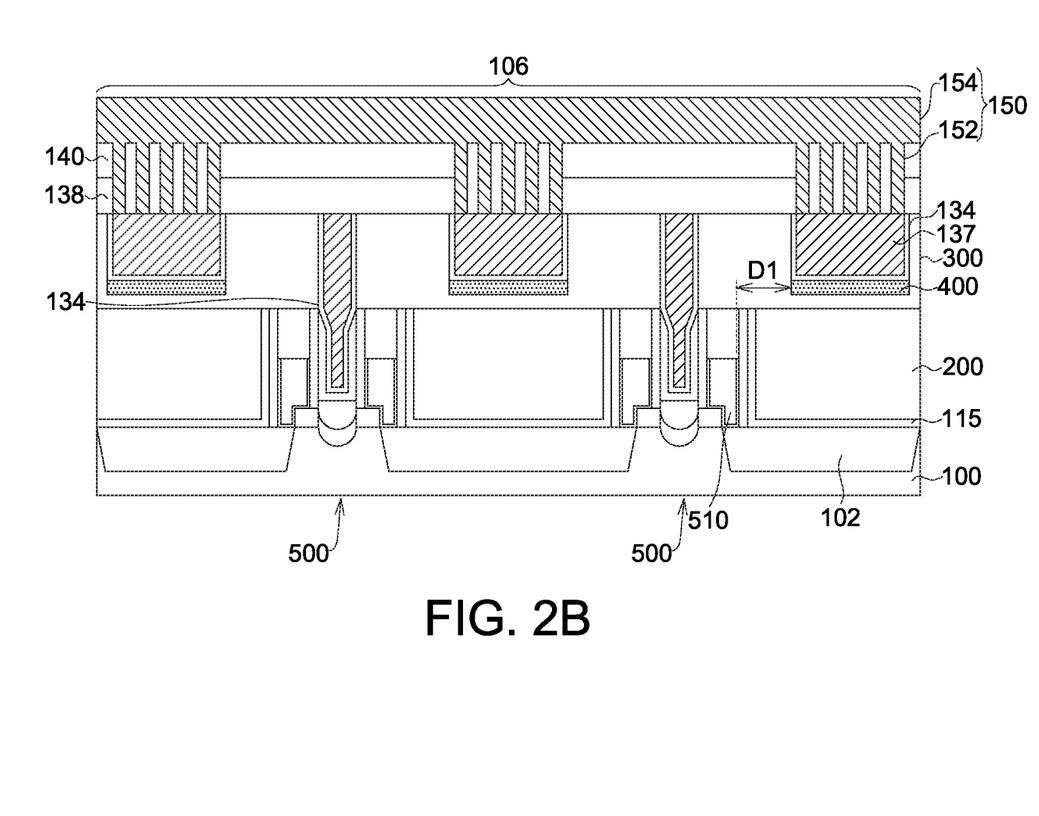
FIG. 2B shows a cross-sectional view of a non-active component region of a semiconductor device structure according to another embodiment of the present disclosure.

FIG. 1 shows a cross-sectional view of a semiconductor device structure according to an embodiment of the present disclosure, FIG. 2A shows a top view of a non-active component region of a semiconductor device structure according to another embodiment of the present disclosure, and FIG. 2B shows a cross-sectional view of a non-active component region of a semiconductor device structure according to another embodiment of the present disclosure.

As shown in FIG. 1, the semiconductor device structure 10 includes a semiconductor substrate 100, a first dielectric layer 200, a second dielectric layer 300, a plurality of high resistivity metal segments 400, a plurality of dummy stacked structures 500 and a metal connection structure 150. The semiconductor substrate 100 has an active component region 104 and a non-active component region 106. The first dielectric layer 200 is formed on the semiconductor substrate 100, and the second dielectric layer 300 is formed on the first dielectric layer 200. The high resistivity metal segments 400 are formed in the second dielectric layer 300 and located in the non-active component region 106, and the high resistivity metal segments 400 are separated from one another. The dummy stacked structures 500 are formed on the semiconductor substrate 100 and located in the non-active component region 106, and at least one dummy stacked structure 500 penetrates through the first dielectric layer 200 and the second dielectric layer 300 and is located between two adjacent high resistivity metal segments 400. The metal connection structure 150 is disposed on the second dielectric layer 300, and the high resistivity metal segments 400 are electrically connected to one another through the metal connection structure 150.

In some embodiments, the active component region 104 may be a transistor region, and the non-active component region 106 may be a passive component region or a dummy component region, for example. The first dielectric layer 200 and the second dielectric layer 300 fully cover the active component region 104 and the non-active component region 106.

In some embodiments, in the non-active component region 106, there may be 2 to 10 high resistivity metal segments located in the non-active component region 106, and multiple dummy stacked structures 500 may be located between two adjacent high resistivity metal segments 400. In other embodiments, the number of the dummy stacked structures 500 penetrating through the first dielectric layer 200 and the second dielectric layer 300 and located between two adjacent high resistivity metal segments 400 in the non-active component region 106 is not limited. As viewed from a top view, the area occupied by the dummy stacked structures 500 may be about 10% or higher than 10% of the total area occupied by the dummy stacked structures 500 and the high resistivity metal segments 400.

According to the embodiments of the present disclosure, in the manufacturing process of the semiconductor device structure 100, when a CMP process is performed on the surface of a dielectric layer (e.g. the surface of the first dielectric layer 200 and/or the second dielectric layer 300) in the non-active component region 106, and there are dummy stacked structure 500 penetrating through the first dielectric layer 200 and the second dielectric layer 300 and locating between two adjacent high resistivity metal segments 400, due to the higher polishing resistance of the dummy stacked structure 500 compared to the dielectric materials, the dishing extent which is otherwise caused by the influence of the CMP process performed on large areas of the surface of the dielectric layer in the non-active component region 106 can be reduced, therefore the surface of the dielectric layer located in the non-active component region 106 can remain planar despite the CMP process performed on large areas of the surface, and the situation where the materials of other films formed in subsequent processing steps remain on the dishing recessed surface can be further prevented. For example, the metal materials of metal gate structures and/or the dielectric materials of hard mask layers can be prevented from remaining on the dishing recessed surface.

In the embodiments, the material of the high resistivity metal segments 400 may include, for example, titanium nitride (TiN), tantalum nitride (TaN), chromium silicide (CrSi), nickel-chromium alloys (NiCr), tungsten silicide (WSi$_x$), and etc. The width of the high resistivity metal segments 400 may equal to or less than 2 microns, preferably 0.3 microns to 1.5 microns, for example.

In the embodiments, as shown in FIG. 1, the semiconductor device structure 10 may further include a plurality of metal gate structures 110 formed on the semiconductor substrate 100 and located in the active component region 104, and the metal gate structures 110 are electrically connected to the metal connection structure 150. In the embodiments, the semiconductor device structure 10 may further include silicon fins 113 and epitaxial source/drain regions 112 located in the active component region 104.

In the embodiments, as shown in FIG. 1, the semiconductor device structure 10 may further include spacers 114, an etch stop layer 115 and self-aligned contact masks 116.

As shown in FIG. 1, in the embodiment, a top surface 500a of at least one dummy gate structure 500 is substantially coplanar with a top surface 300a of the second dielectric layer 300. That is, the top of at least one dummy gate structure 500 extends to the top of the second dielectric layer 300.

In some embodiments, the dummy stacked structure 500 may include dummy gate structures 510, dummy silicon fins 513 and a metal layer 536, as shown in FIG. 1, the metal layer 536 of the dummy stacked structure 500 penetrates through the first dielectric layer 200 and the second dielectric layer 300 and is located between two adjacent high resistivity metal segments 400. As shown in FIG. 1, in the embodiments, the top surface 536a (i.e. the top surface 500a of the dummy stacked structure 500) is substantially coplanar with the top surface 300a of the second dielectric layer 300.

In the embodiment, the dummy stacked structure 500 may further include dummy epitaxial source/drain regions 512.

As shown in FIG. 1, in the embodiments, the top surface 500a of at least one dummy stacked structure 500 is located above a top surface 400a of the high resistivity metal segments 400. For example, the top surface 536a (i.e. the top surface 500a of the dummy stacked structure 500) is located above the top surface 400a of the high resistivity metal segments 400.

In some embodiments, as shown in FIG. 1, each of the dummy stacked structures 500 is spaced from each of the high resistivity metal segments 400 by a distance D1, and the distance D1 is for example from equal to or larger than 70 nm to equal to or less than 500 nm. For example, the distance D1 is also the distance between the dummy gate structure 510 and the high resistivity metal segments 400 in the first dielectric layer 200.

As shown in FIG. 1, in the embodiments, the dummy stacked structures 500 are electrically isolated from the metal connection structure 150. That is, the dummy gate structures 510, the dummy silicon fins 513 and the metal layer 536 are electrically isolated from the metal connection structure 150.

In some embodiments, as shown in FIG. 1, the spacers 114 are formed on two sides of the metal gate structures 110 and on two sides of the dummy gate structures 510, and the self-aligned contact masks 116 are formed on the metal gate structures 110 and on the dummy gate structures 510.

In some embodiments, the semiconductor device structure 10 may further include barrier metal layers 134 and hard mask layers 126. In some embodiments, the semiconductor device structure 10 may further include connection metal layers 136 and connection metal layers 137, and the connection metal layers 136 and the connection metal layers 137 are located on the barrier metal layers 134. In an embodiment, as shown in FIG. 1, in the non-active component region 106, each of the hard mask layers 126 is located on a corresponding high resistivity metal segment 400, and the barrier metal layers 134 penetrate through the hard mask layers 126, the high resistivity metal segments 400 and the buffer dielectric layer 122 to be located on the first dielectric layer 200. The connection metal layers 136 are located on the barrier metal layers 134 and electrically connected to the high resistivity metal segments 400 with lateral sides. In some embodiments, the connection metal layers 137 extend into the first dielectric layer 200 by a depth of about 20 nm to 30 nm, or 24 nm to 26 nm. In some embodiments, the connection metal layer 137 may have a tapered cross-sectional shape with a width decreasing from top to bottom. The top cross-sectional width of the tapered cross-section is 1.5 to 2 times the bottom cross-sectional width of the tapered cross-section; alternatively, the difference between the top cross-sectional width and the bottom cross-sectional width of the tapered cross-section may be for example about 15 nm to 20 nm. For example, in one embodiment, the top cross-sectional width of the tapered cross-section of the connection metal layer 137 may be for example about 57 nm, the bottom cross-sectional width may be for example about 39 nm, the depth of the connection metal layers 137 extending into the first dielectric layer 200 is about 26 nm, and the two inclined angles of two sides of the tapered cross-section are about 75 degrees to 85 degrees, or 78 degrees to 83 degrees.

In another embodiment, in the non-active component region 106, each of the hard mask layers 126 is located on a corresponding high resistivity metal segment 400, the barrier metal layers 134 penetrate through the hard mask layers 126 and are located on the high resistivity metal segments 400, and the connection metal layers 137 are located on the barrier metal layers 134 and electrically connected to the high resistivity metal segments 400 (not shown in drawings).

As shown in FIG. 1, in the embodiments, the second dielectric layer 300 may include a buffer dielectric layer 122 and a pre-metal dielectric (PMD) layer 132. The buffer dielectric layer 122 is disposed on the first dielectric layer 200, and the PMD layer 132 is disposed on the buffer dielectric layer 122. As shown in FIG. 1, the high resistivity metal segments 400 are formed on the buffer dielectric layer 122 and covered by the PMD layer 132. That is, the high resistivity metal segments 400 are embedded in the second dielectric layer 300.

As shown in FIG. 1, in the embodiments, the semiconductor device structure 10 may further include a plurality of shallow trench isolation structures 102, and the shallow trench isolation structures 102 are buried in the semiconductor substrate 100. As shown in FIG. 1, in the embodiments, each of the shallow trench isolation structures 102 located in the non-active component region 106 is correspondingly located below each of the high resistivity metal segments 400.

As shown in FIG. 1, in the embodiments, the semiconductor device structure 10 may further include an etch barrier layer 138 and an interlayer dielectric layer 140. The etch barrier layer 138 is formed on the second dielectric layer 300, and the interlayer dielectric layer 140 is formed on the etch barrier layer 138. In the embodiments, the metal connection structure 150 may include a plurality of contact plugs 152 and a wiring structure 154. The contact plugs 152 penetrate through the etch barrier layer 138 and the interlayer dielectric layer 140 to be electrically connected to the high resistivity metal segments 400, and the dummy stacked structures 500 are electrically isolated from the contact plugs 152.

For example, as shown in FIG. 1, in the embodiments, the wiring structure 154 is electrically connected to the contact plugs 152, the contact plugs 152 penetrate through the etch barrier layer 138 and the interlayer dielectric layer 140 to be electrically connected to the connection metal layers 137, and the connection metal layers 137 are electrically connected to the high resistivity metal segments 400.

In some embodiments, the non-active component region 106 of the semiconductor device structure 10 as shown in FIG. 1 may have the structures as shown in FIG. 2A to FIG. 2B. While the semiconductor device structure 10 as shown in FIG. 1 may be provided with alternative structures. In the first structure the semiconductor device structure 10 may have connection metal layers 137 penetrating though the high resistivity metal segments 400 and extending into the first dielectric layer 200 while in the second structure the semiconductor device structure 10 may have connection metal layers 137 not penetrating though the high resistivity metal segments 400 and not extending into the first dielectric layer 200. In order to show these two structures, FIG. 2B only shows the second structure where the connection metal layers 137 are not penetrating though the high resistivity metal segments 400 and are not extending into the first dielectric layer 200. As shown in FIG. 2A, the high resistivity metal segments 400 have rectangular strip structures as viewed from a top view, and the high resistivity metal segments 400 are electrically connected in parallel through the metal connection structure 150. For example, referring to FIG. 2A and FIG. 2B, the wiring structure 154 of the metal connection structure 150 is electrically connected to the contact plugs 152, the contact plugs 152 penetrate through the etch barrier layer 138 and the interlayer dielectric layer 140 to be electrically connected to the connection metal layers 137, and the connection metal layers 137 are electrically connected to the high resistivity metal segments 400. The connection metal layers 137 as shown in FIG. 2B are directly contacting the high resistivity metal segments 400 without penetrating through the high resistivity metal segments 400, yet in the alternative structure, the barrier metal layers 134 may be provided similar to the structure of the barrier metal layers 134, as shown in FIG. 1, penetrating through the hard mask layers 126 and the high resistivity metal segments 400 (and optionally penetrating through the buffer dielectric layer 122 as shown in FIG. 1) and located on the first dielectric layer 200, and the connection metal layers 137 are located on the barrier metal layers 134 and electrically connected to the high resistivity metal segments 400 with lateral sides (not shown in FIG. 2B).

FIG. 3A to FIG. 3H are cross-sectional views showing a manufacturing process of a semiconductor device structure according to an embodiment of the present disclosure. The elements in the present embodiment sharing similar or the same labels with those in the previous embodiment are similar or the same elements, and the description of which is omitted.

Figure 3A:
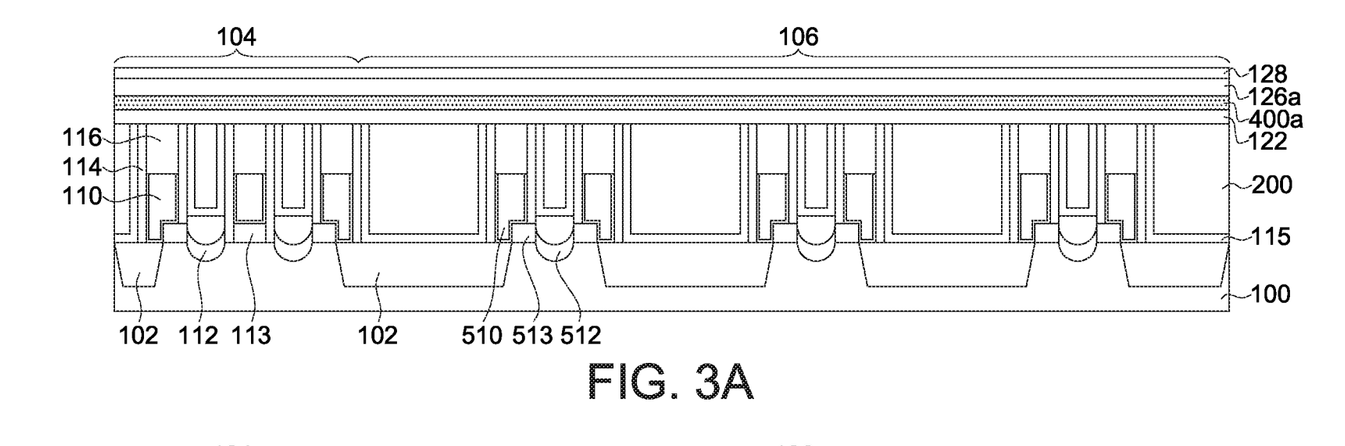
FIG. 3A to FIG. 3H are cross-sectional views showing a manufacturing process of a semiconductor device structure according to an embodiment of the present disclosure.

As shown in FIG. 3A, a semiconductor substrate 100 is provided, and the semiconductor substrate 100 has an active component region 104 and a non-active component region 106. A portion of the semiconductor substrate 100 is removed by etching to form the silicon fins 113 and the dummy silicon fins 513. Next, at least one insulating material (e.g. oxides) is deposited on the semiconductor substrate 100, the silicon fins 113 and the dummy silicon fins 513, the insulating material is polished by a CMP process, and a portion of the insulating material is removed by etching to expose the silicon fins 113 and the dummy silicon fins 513 and to form shallow trench isolation structures 102 buried in the semiconductor substrate 100. Next, a layer of amorphous silicon or polysilicon is deposited on the silicon fins 113, the dummy silicon fins 513 and the shallow trench isolation structures 102, and then a patterning process and a CMP process are performed on the layer of amorphous silicon or polysilicon for forming patterned amorphous silicon or polysilicon structures, which will be used for forming gate structures in subsequent processing steps. Next, epitaxial source/drain regions 112 and dummy epitaxial source/drain regions 512 are formed, a silicide layer is formed on the epitaxial source/drain regions 112 and dummy epitaxial source/drain regions 512, and spacers 114 and an etch stop layer 115 are formed. In the embodiments, the materials of the spacers 114 and the etch stop layer 115 may be, for example, silicon dioxide, silicon nitride, silicon carbonitride, silicon oxynitride, silicon carbide, or any combinations thereof.

Next, a dielectric material is formed on the semiconductor substrate 100 and covering the silicon fins 113, the dummy silicon fins 513 and the aforementioned patterned amorphous silicon or polysilicon structures, and then a portion of the dielectric material is removed by a CMP process to expose the aforementioned patterned amorphous silicon or polysilicon structures. Next, a replacement metal gate (RMG) process may be applied on the patterned amorphous silicon or polysilicon structures to form metal gate structures 110 and dummy gate structures 510 on the semiconductor substrate 100, the metal gate structures 110 are located in the active component region 104, and the metal gate structures 110 are used for electrically connecting to the metal connection structure 150 formed subsequently. In the embodiments, the manufacturing process of forming the metal gate structures 110 and the dummy gate structures 510 may include forming a metal inner layer for gate electrodes and forming a dielectric outer layer for gate dielectric. The metal inner layer may primarily comprise a low resistivity metal material and a work function metal material, the low resistivity metal material may include a metallic material such as tungsten, aluminum or copper, the work function metal material may include a metal alloy or a metal compound such as titanium nitride (TiN), tantalum nitride (TaN) or titanium aluminum carbide (TiAlC), and the dielectric outer layer may comprise a high dielectric material such as hafnium silicate, zirconium silicate, hafnium dioxide or zirconium dioxide. Next, an etch-back process may be performed on the metal materials from above the metal gate structures 110 and the dummy gate structures 510, then a metal nitride material or other high etch-resistant material fills in, and a CMP process is performed on the metal nitride material or other high etch-resistant material to form the metal gate structures 110, the dummy gate structures 510 and the self-aligned contact masks 116 formed thereon. As such, the first dielectric layer 200 fills the gaps between the metal gate structures 110 in the active component region 104 and the gaps between the dummy gate structures 510 in the non-active component region 106.

Next, as shown in FIG. 3A, the buffer dielectric layer 122 is formed on the first dielectric layer 200, and high resistivity metal material layer 400a, the hard mask layer 126a and the cap oxide layer 128 are formed in order. The material of the high resistivity metal material layer 400a may include, for example titanium nitride (TiN), tantalum nitride (TaN), chromium silicide (CrSi), nickel-chromium alloys (NiCr), tungsten silicide (WSi$_x$) formed by atomic layer deposition (ALD), physical vapor deposition (PVD), chemical vapor deposition (CVD) or any combinations thereof. The thickness of the high resistivity metal material layer 400a ranges from about 30 angstroms to 60 angstroms. The hard mask layer 126a may be a silicon nitride layer formed by sub-atmospheric pressure chemical vapor deposition (SACVD), for example.

Figure 3B:
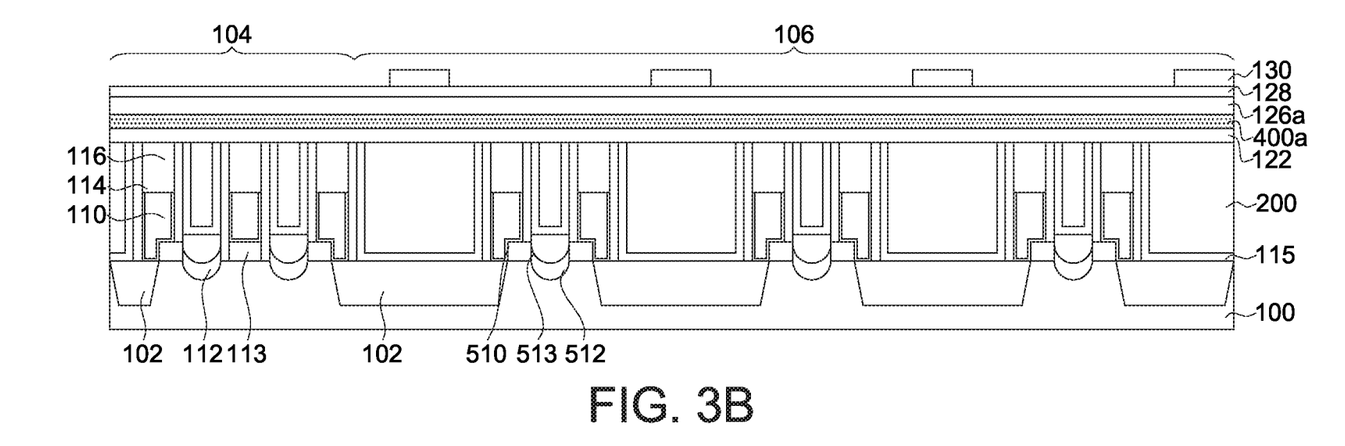

Next, as shown in FIG. 3B, a patterned photoresist layer 130 is formed on the cap oxide layer 128.

Figure 3C:
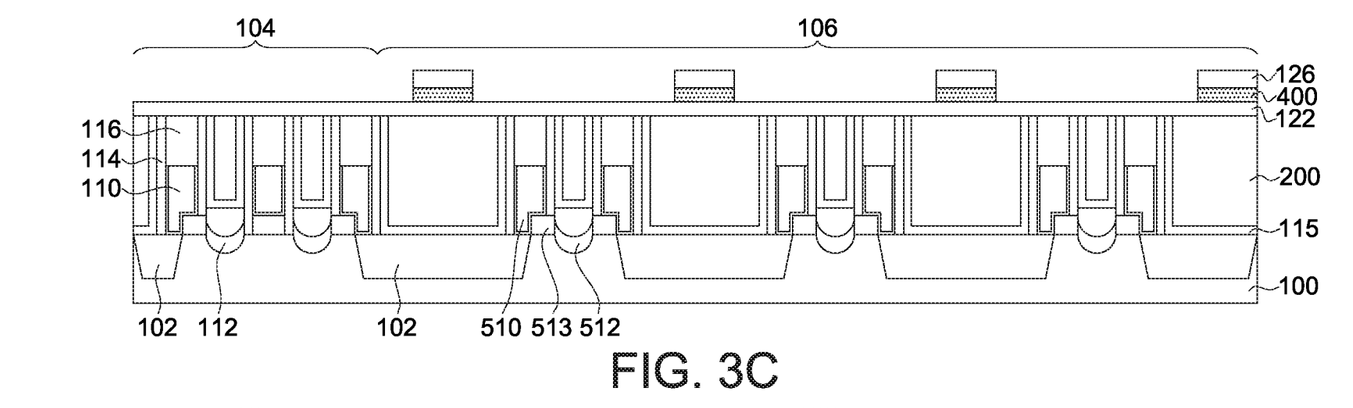

As shown in FIG. 3C, using the patterned photoresist layer 130 as an etching mask, an etching process is performed until the buffer dielectric layer 122 is exposed, to pattern the high resistivity metal material layer 400a and the hard mask layer 126a to eventually form the high resistivity metal segments 400 and the hard mask layers 126. Then the remained cap oxide layer and the patterned photoresist layer 130 are removed.

Figure 3D:
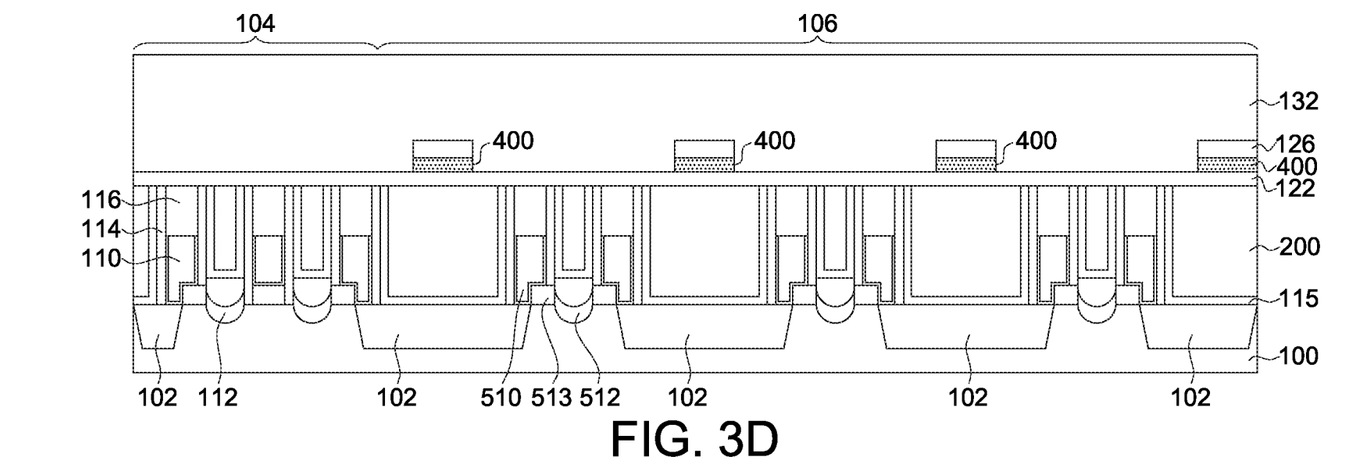

As shown in FIG. 3D, after the high resistivity metal segments 400 are formed, the PMD layer 132 is formed on the buffer dielectric layer 122 and covering the high resistivity metal segments 400. As such, the second dielectric layer 300 is formed on the first dielectric layer 200, and a plurality of high resistivity metal segments 400 separated from one another are formed in the second dielectric layer 300 and located in the non-active component region 106. In addition, each of the shallow trench isolation structures 102 located in the non-active component region 106 is correspondingly located below each of the high resistivity metal segments 400.

Figure 3E:
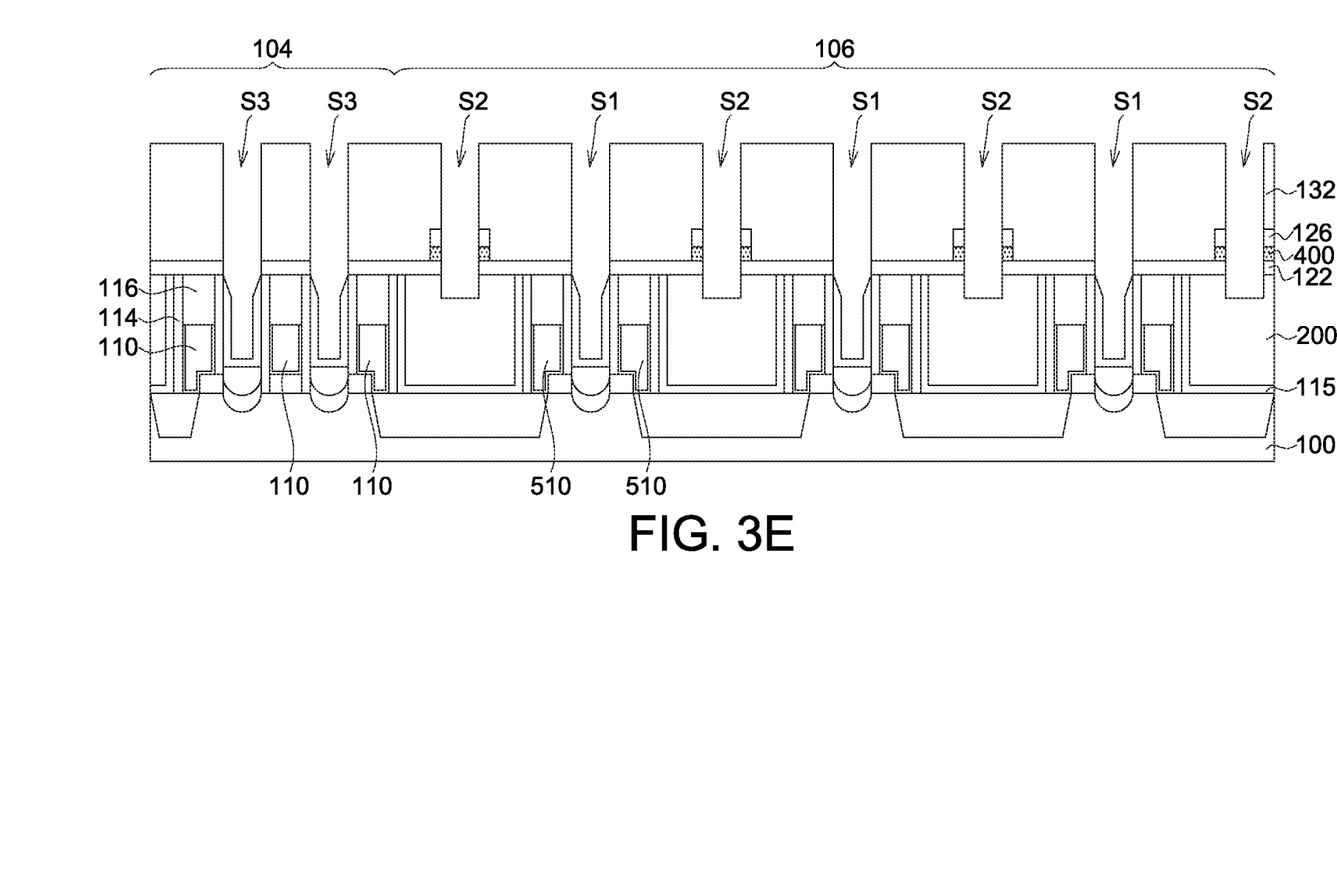

Next, as shown in FIG. 3E, a portion of the PMD layer 132 in the active component region 104 is removed to form contact openings S3 penetrating through the PMD layer 132, and the first dielectric layer 200 between the metal gate structures 110 is removed. In the non-active component region 106, the PMD layer 132, the hard mask layers 126, the high resistivity metal segments 400, and the buffer dielectric layer 122 are partially removed (the first dielectric layer 200 may also be partially removed) to form contact openings S2, and the contact openings S2 penetrate through the PMD layer 132, the hard mask layers 126, the high resistivity metal segments 400 and the buffer dielectric layer 122 and located on the first dielectric layer 200. In an alternative embodiment, the contact openings S2 may be formed by partially removing the PMD layer 132 and the hard mask layers 126 (and optionally partially removing the high resistivity metal segments 400), and the so-formed contact openings S2 penetrate through the PMD layer 132 and the hard mask layers 126 without penetrating through the high resistivity metal segments 400 (not shown in FIG. 3E). In the non-active component region 106, the PMD layer 132 is partially removed to form the contact openings S1, the contact openings S1 penetrate through the PMD layer 132, and then the first dielectric layer 200 between the dummy gate structures 510 is removed.

Figure 3F:
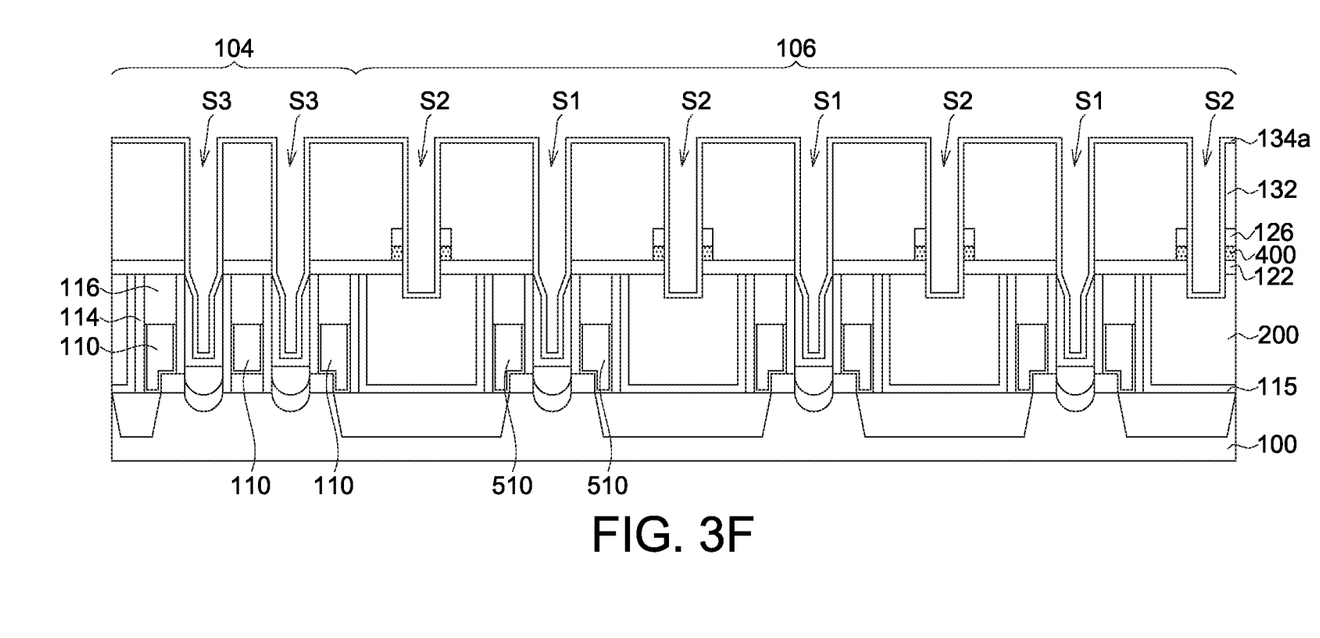

As shown in FIG. 3F, a barrier metal layer 134a is formed to conformally cover the active component region 104 and the non-active component region 106. The barrier metal layer 134a conformally covers the inner surfaces of the contact openings S1, S2 and S3. The barrier metal layer 134a may be a composite layer of titanium, titanium nitride, or titanium/titanium nitride, for example.

Figure 3G:
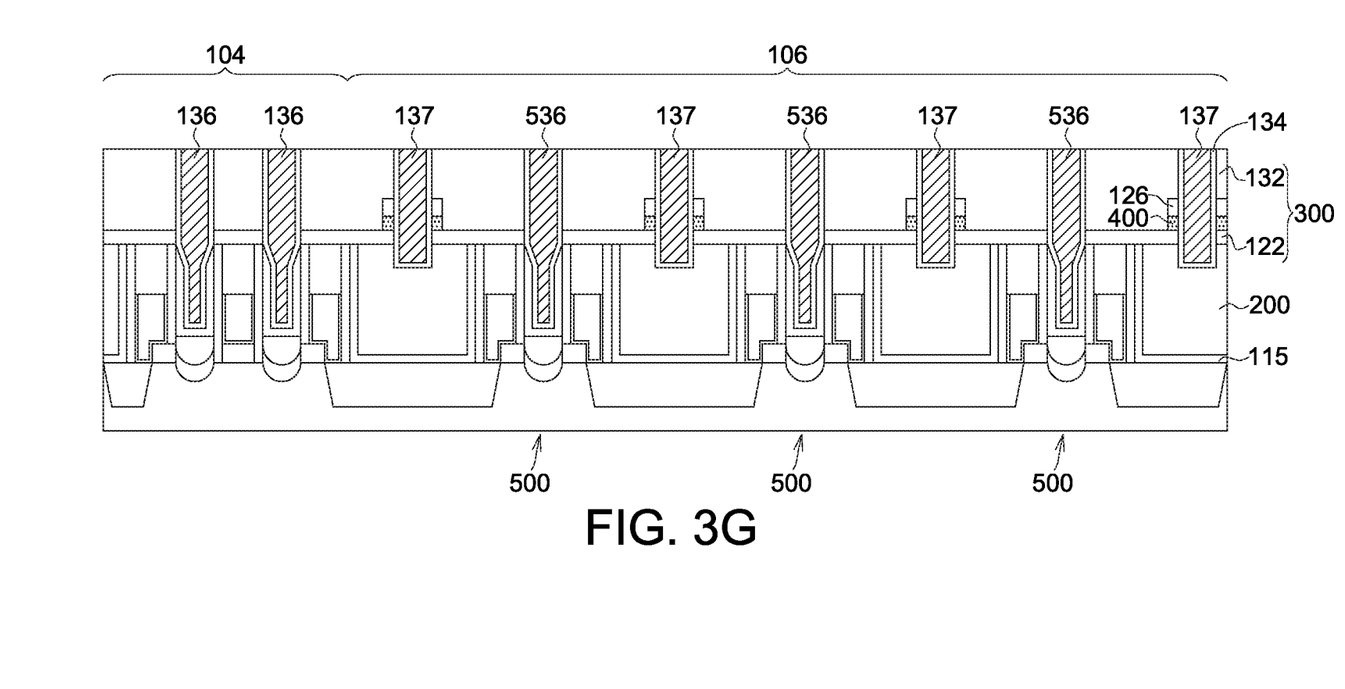

Next, as shown in FIG. 3G, a metal material is formed to cover the barrier metal layer 134a and fill up the contact openings S1, S2 and S3. Next, a CMP process is performed to remove and planarize the excess metal material, the barrier metal layer 134a and the PMD layer 132a to form the connection metal layers 136, the connection metal layers 137, the metal layers 536, the barrier metal layers 134 and the PMD layer 132. In this embodiment, the materials of the connection metal layers 136, the connection metal layers 137 and the metal layers 536 for example include tungsten, and the CMP process may be a tungsten chemical mechanical polishing process, for example. In fact, the barrier metal layers 134 may be independently combined with the connection metal layers 136, the connection metal layers 137 and the metal layers 536 to achieve electrical connections.

As such, as shown in FIG. 3G, a plurality of dummy stacked structures 500 are formed on the semiconductor substrate 100 and located in the non-active component region 106, at least one dummy stacked structure 500 penetrates through the first dielectric layer 200 and the second dielectric layer 200 (the buffer dielectric layer 122 and the PMD layer 132) and is located between two adjacent high resistivity metal segments 400.

According to the embodiments of the present disclosure, as shown in FIG. 3G, since the dummy stacked structure 500 penetrates through the first dielectric layer 200 and the second dielectric layer 300 and is located between two adjacent high resistivity metal segments 400, the dishing extent which is caused by the influence of the CMP process performed on large areas of the surface of the dielectric layer in the non-active component region 106 can be reduced, therefore the surface of the dielectric layer located in the non-active component region 106 can remain planar despite the CMP process performed on large areas of the surface, and the situation where the materials of other films formed in subsequent processing steps remain on the dishing recessed surface can be further prevented.

Figure 3H:
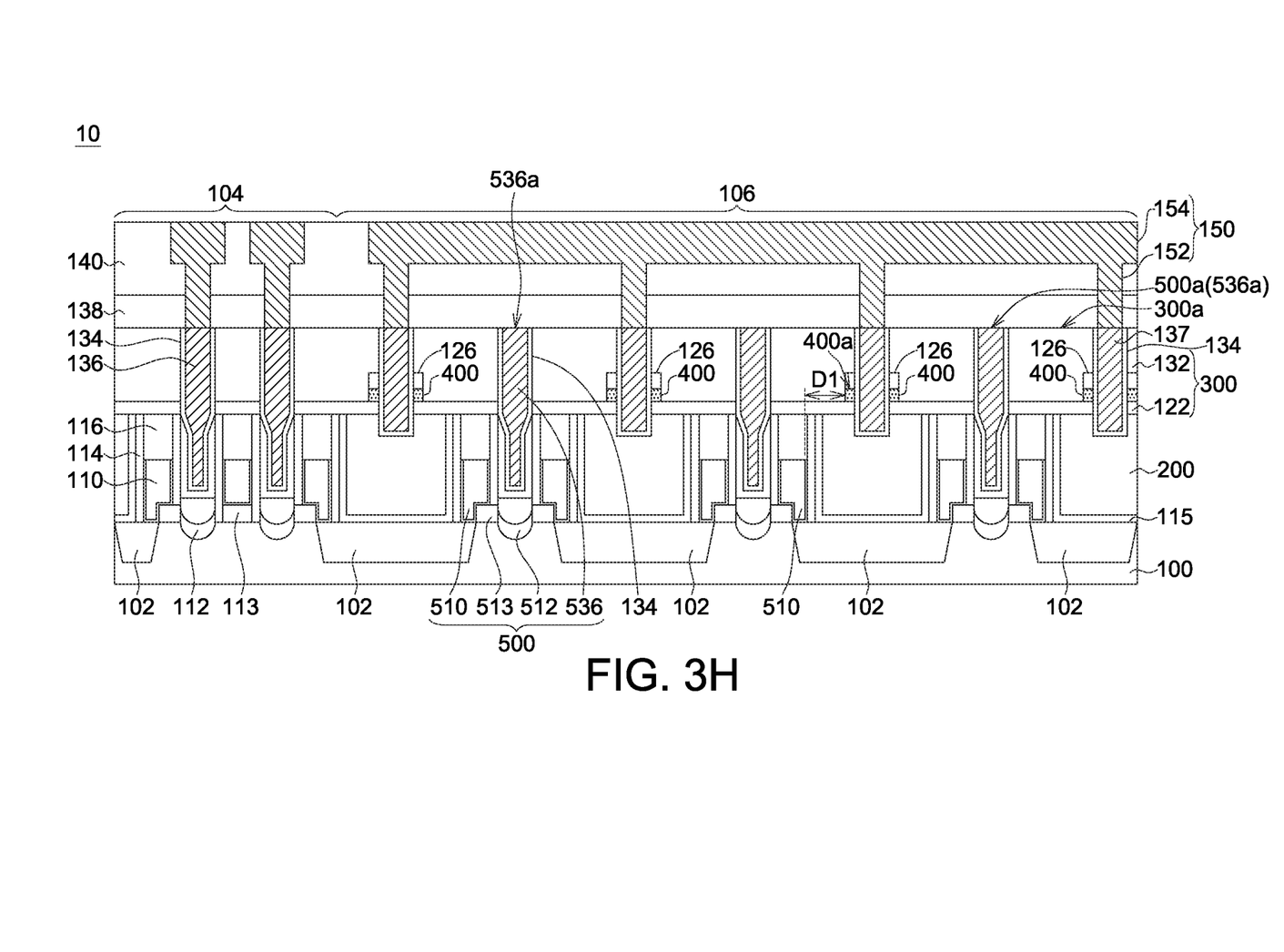

Next, as shown in FIG. 3H, an etch barrier layer 138 is formed on the second dielectric layer 300, and an interlayer dielectric layer 140 is formed on the etch barrier layer 138. In addition, a metal connection structure 150 is formed on the second dielectric layer 300, such that the high resistivity metal segments 400 are electrically connected to one another through the metal connection structure 150.

For example, the etch barrier layer 138 and the interlayer dielectric layer 140 may be formed to fully cover the second dielectric layer 300, holes or trenches are formed penetrating through the etch barrier layer 138 and the interlayer dielectric layer 140, and then a metal material is filled in the holes or trenches to form the contact plugs 152. The contact plugs 152 penetrate through the etch barrier layer 138 and the interlayer dielectric layer 140 to be electrically connected to the high resistivity metal segments 400. In the embodiment, as shown in FIG. 3H, the contact plugs 152 are electrically connected to the high resistivity metal segments 400 through the connection metal layers 137, and the dummy stacked structures 500 are electrically isolated from the contact plugs 152.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor device structure, comprising:
   providing a semiconductor substrate having an active component region and a non-active component region, wherein the active component region and the non-active component region are disposed along a direction parallel to a top surface of the semiconductor substrate;
   forming a first dielectric layer on the semiconductor substrate;
   forming a second dielectric layer on the first dielectric layer;
   forming a plurality of high resistivity metal segments in the second dielectric layer and located in the non-active component region, wherein the high resistivity metal segments are separated from one another;
   forming a plurality of dummy stacked structures on the semiconductor substrate and located in the non-active component region, wherein at least one dummy stacked structure of the plurality of the dummy stacked structures penetrates through the first dielectric layer and the second dielectric layer and is located between two adjacent high resistivity metal segments of the plurality of the high resistivity metal segments; and
   forming a metal connection structure on the second dielectric layer, wherein the plurality of the high resistivity metal segments are electrically connected to one another through the metal connection structure.

2. The manufacturing method of the semiconductor device structure according to claim 1, wherein a top surface of the at least one dummy stacked structure is substantially coplanar with a top surface of the second dielectric layer.

3. The manufacturing method of the semiconductor device structure according to claim 1, wherein a top surface of the at least one dummy stacked structure is located above a top surface of the high resistivity metal segments.

4. The manufacturing method of the semiconductor device structure according to claim 1, wherein the dummy stacked structures are electrically isolated from the metal connection structure.

5. The manufacturing method of the semiconductor device structure according to claim 1, wherein forming the second dielectric layer comprises:
   forming a buffer dielectric layer on the first dielectric layer; and
   after forming the high resistivity metal segments, forming a pre-metal dielectric (PMD) layer on the buffer dielectric layer and covering the high resistivity metal segments.

6. The manufacturing method of the semiconductor device structure according to claim 1, wherein each of the dummy stacked structures is spaced from each of the high resistivity metal segments by a distance, and the distance is from equal to or larger than 70 nm to equal to or less than 500 nm.

7. The manufacturing method of the semiconductor device structure according to claim 1, further comprising:
   forming a plurality of metal gate structures on the semiconductor substrate and located in the active component region, wherein the metal gate structures are electrically connected to the metal connection structure.

8. The manufacturing method of the semiconductor device structure according to claim 1, further comprising:
forming a plurality of shallow trench isolation structures buried in the semiconductor substrate, wherein each of the shallow trench isolation structures located in the non-active component region is correspondingly located below each of the high resistivity metal segments.

9. The manufacturing method of the semiconductor device structure according to claim 1, wherein the high resistivity metal segments have rectangular strip structures as viewed from a top view perspective, and the high resistivity metal segments are electrically connected in parallel through the metal connection structure.

10. The manufacturing method of the semiconductor device structure according to claim 1, further comprising:
forming an etch barrier layer on the second dielectric layer; and
forming an interlayer dielectric layer on the etch barrier layer, wherein forming the metal connection structure comprises forming a plurality of contact plugs penetrating through the etch barrier layer and the interlayer dielectric layer to be electrically connected to the high resistivity metal segments, and the dummy stacked structures are electrically isolated from the contact plugs.

* * * * *